(12) United States Patent
Ma et al.

(10) Patent No.: US 8,741,763 B2
(45) Date of Patent: Jun. 3, 2014

(54) LAYOUT DESIGNS WITH VIA ROUTING STRUCTURES

(75) Inventors: Yuansheng Ma, Santa Clara, CA (US);
Jongwook Kye, Pleasanton, CA (US);
Harry Levinson, Saratoga, CA (US);
Hidekazu Yoshida, San Jose, CA (US);
Mahbub Rashed, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 96 days.

(21) Appl. No.: 13/465,129

(22) Filed: May 7, 2012

(65) Prior Publication Data
US 2013/0292772 A1 Nov. 7, 2013

(51) Int. Cl.
*H01L 21/44* (2006.01)
*H01L 23/528* (2006.01)

(52) U.S. Cl.
USPC .................... 438/599; 257/E21.249; 438/669

(58) Field of Classification Search
CPC .......................... H01L 27/0207; H01L 23/528
USPC .................... 438/98, 599, 669; 257/E21.249
See application file for complete search history.

(56) References Cited

U.S. PATENT DOCUMENTS

2010/0011330 A1* 1/2010 Becker et al. .................... 716/10
2011/0049635 A1* 3/2011 Carlson ......................... 257/368

\* cited by examiner

*Primary Examiner* — Colleen Matthews
*Assistant Examiner* — Regan J Rundio
(74) *Attorney, Agent, or Firm* — Ditthavong Mori & Steiner, P.C.

(57) ABSTRACT

An approach for providing layout designs with via routing structures is disclosed. Embodiments include: providing a gate structure and a diffusion contact on a substrate; providing a gate contact on the gate structure; providing a metal routing structure that does not overlie a portion of the gate contact, the diffusion contact, or a combination thereof; and providing a via routing structure over the portion and under a part of the metal routing structure to couple the gate contact, the diffusion contact, or a combination thereof to the metal routing structure.

17 Claims, 7 Drawing Sheets

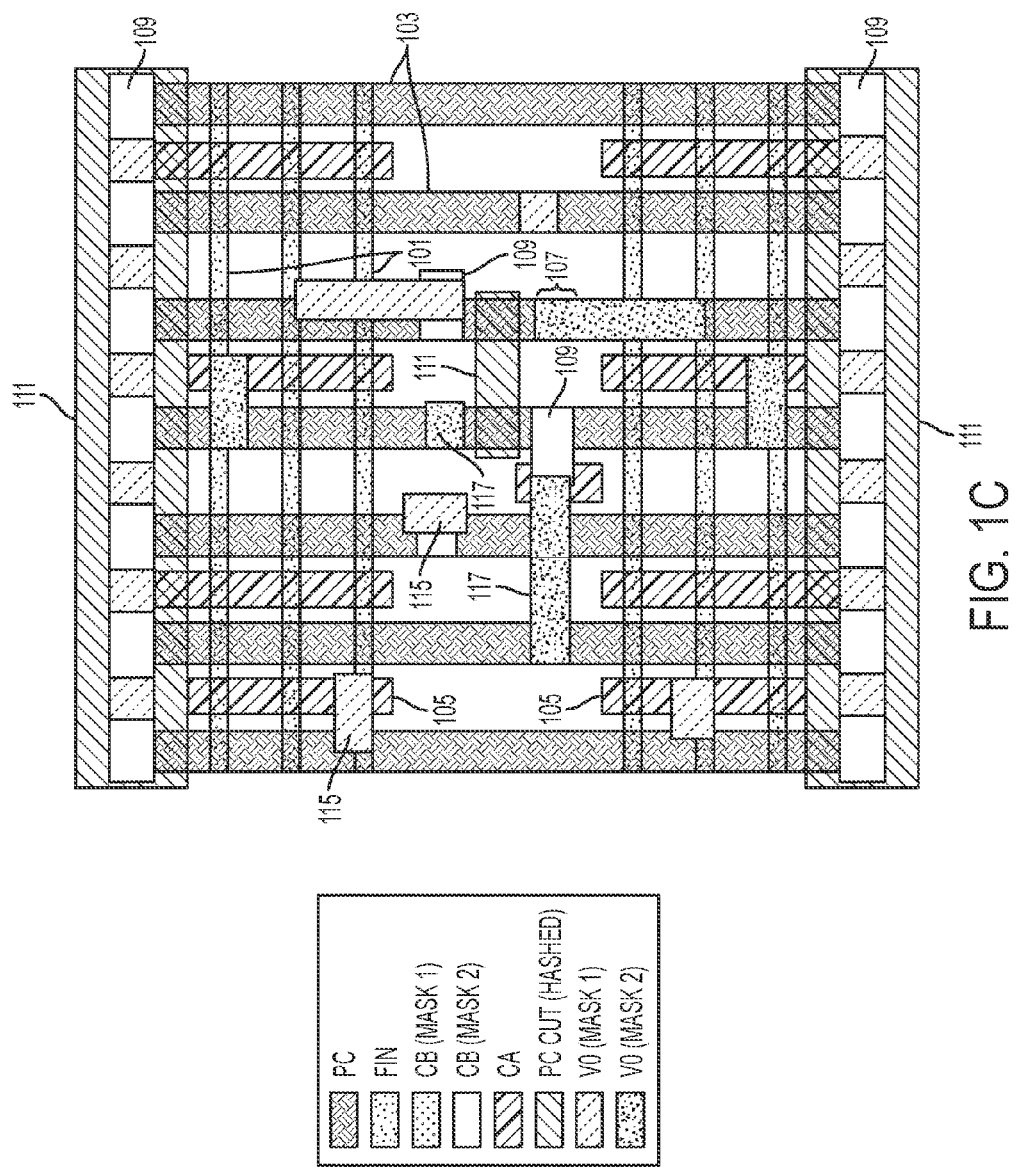

LAYOUT DESIGNS WITH VIA ROUTING STRUCTURES

TECHNICAL FIELD

The present disclosure relates to layout designs. The present disclosure is particularly applicable to designs in 14 nanometer (nm) technology nodes and beyond.

BACKGROUND

As technology advances, layouts must be designed to meet scaling requirements, for instance, based on the decreasing size of technology nodes, creating significant process integration risks for the middle-of-line (MOL) processes. For example, to satisfy scaling requirements, designers typically utilize constructs such as diffusion contact flyovers (CA flyovers), for instance, to implement cross-coupling-based designs. However, as technology nodes continue to scale down, the use of CA flyovers increases the risk that transistors and other integrated structures are unintentionally activated, reducing the integrity of the overall device. Moreover, as technology nodes scale down, costs associated with masks are significantly increased for MOL processes (e.g., diffusion contacts, metal1 layer structures, etc.). Furthermore, the number of masks for MOL processes may increase under traditional techniques, driving costs even higher. By way of example, traditional techniques may require triple patterning to form diffusion contacts and metal1 layer structures that satisfy tip-to-tip space requirements of diffusion contacts (e.g., in the power rail region) and metal1 layer structures for 14 nm technology nodes and beyond.

A need therefore exists for layout designs with alternative routing structures to CA flyover (such as via routing structures) along with such designs implemented using self-aligned double patterning (SADP) processes, and enabling methodology.

SUMMARY

An aspect of the present disclosure is a method for implementing a layout design with via routing structures.

Another aspect of the present disclosure is a device implemented using a layout design with via routing structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a gate structure and a diffusion contact on a substrate; providing a gate contact on the gate structure; providing a metal routing structure that does not overlie a portion of the gate contact, the diffusion contact, or a combination thereof; and providing a via routing structure over the portion and under a part of the metal routing structure to couple the gate contact, the diffusion contact, or a combination thereof to the metal routing structure.

Aspects of the present disclosure include: providing a second gate structure on the substrate; and providing the via routing structure to cross over the second gate structure to couple the diffusion contact, the gate contact, or a combination thereof to the metal routing structure. Additional aspects include: providing a third gate structure on the substrate; providing a second metal routing structure over the substrate; providing a second gate contact on the first, second, or third gate structures; providing a plurality of fin structures across the first, second, and third gate structures; and providing a second via routing structure crossing over at least one of the fin structures to couple the gate contact, the second gate contact, or a combination thereof to the metal routing structure, the second metal routing structure, or a combination thereof. A further aspect includes the via routing structure and the second via routing structure being via0 layer structures, and the metal routing structure and the second metal routing structure being metal1 layer structures. Another aspect includes providing the plurality of fin structures without merging of the fin structures.

Further aspects of the present disclosure include: providing a diffusion gap region in the substrate; and providing the diffusion contact in the diffusion gap region. Some aspects include: providing another gate structure on the substrate; and providing another gate contact to couple the diffusion contact to the other gate structure. Various aspects include providing the diffusion contact and the metal routing structure using a SADP process. Other aspects include the SADP process utilizing a core mask and a block mask over the core mask.

An additional aspect of the present disclosure is a device including: a gate structure and a diffusion contact on a substrate; a gate contact on the gate structure; a metal routing structure that does not overlie a portion of the gate contact, the diffusion contact, or a combination thereof; and a via routing structure over the portion and under a part of the metal routing structure, wherein the via routing structure couples the gate contact, the diffusion contact, or a combination thereof to the metal routing structure.

Aspects include a device having a second gate structure on the substrate, wherein the via routing structure crosses over the second gate structure to couple the diffusion contact, the gate contact, or a combination thereof to the metal routing structure. Additional aspects include a device having: a third gate structure on the substrate; a second metal routing structure over the substrate; a second gate contact on the first, second, or third gate structures; a plurality of fin structures across the first, second, and third gate structures; and a second via routing structure crossing over at least one of the fin structures, wherein the second via routing structure couples the gate contact, the second gate contact, or a combination thereof to the metal routing structure, the second metal routing structure, or a combination thereof. One aspect includes the via routing structure and the second via routing structure being via0 layer structures, and the metal routing structure and the second metal routing structure being metal 1 layer structures. Another aspect includes the plurality of fin structures not being merged with each other.

Further aspects include a device having a diffusion gap region in the substrate, wherein the diffusion contact is in the diffusion gap region. Some aspects include a device having: another gate structure on the substrate; and another gate contact coupling the diffusion contact to the other gate structure. Various aspects include the diffusion contact and the metal routing structure being provided using a SADP process. Other aspects include the SADP process utilizing a core mask and a block mask over the core mask.

Another aspect of the present disclosure includes: providing a first metal routing structure over a substrate; providing a second metal routing structure that does not overlie a portion of the first metal routing structure; and providing a via routing structure over the portion and under a part of the second metal routing structure to couple the first metal routing structure to the second metal routing structure.

Additional aspects include: providing a gate structure and a diffusion contact on the substrate; providing a gate contact on the gate structure; providing a third metal routing structure that does not overlie a second portion of the gate contact, the diffusion contact, or a combination thereof, the third metal routing structure being at a depth level below the second metal routing structure; and providing a second via routing structure over the second portion and under a part of the third metal routing structure to couple the gate contact, the diffusion contact, or a combination thereof to the third metal routing structure. Further aspects include: providing a second gate structure on the substrate; and providing the second via routing structure to cross over the second gate structure to couple the diffusion contact, the gate contact, or a combination thereof to the third metal routing structure, wherein the second via routing structure is a via0 layer structure, and the third metal routing structure is a metal1 layer structure.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1D schematically illustrate components of a layout with via routing structures, in accordance with an exemplary embodiment of the present disclosure;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of reduced layout integrity (e.g., resulting from CA flyover constructs), and increased patterning costs associated with layout design. The present disclosure addresses and solves such problems, for instance, by, inter alia, providing a via routing structure that is over a portion of a diffusion contact and/or gate contact to couple the diffusion contact and/or the gate contact to a metal routing structure that does not overlie the portion.

Figure 1A:
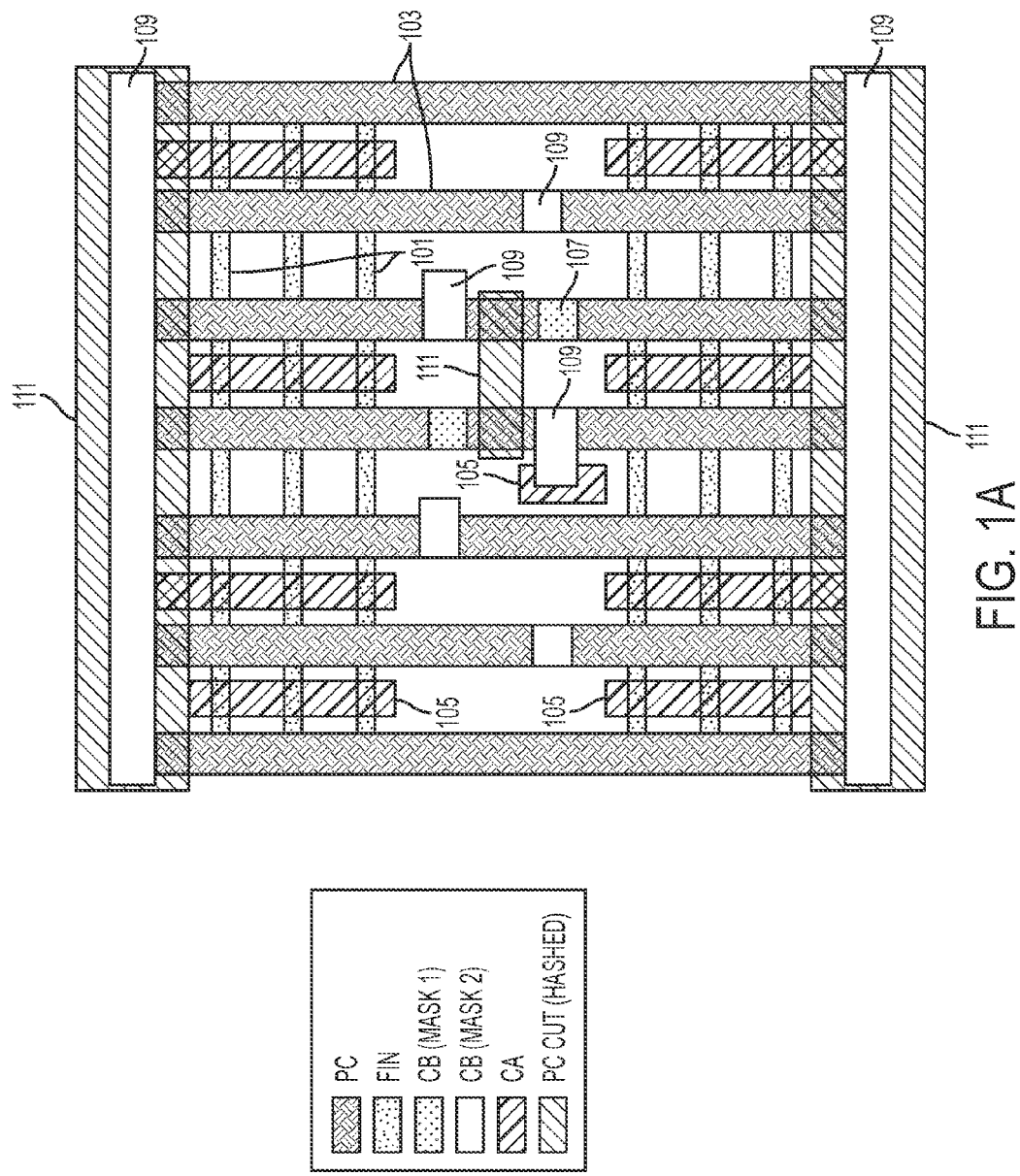
Figure 1B:
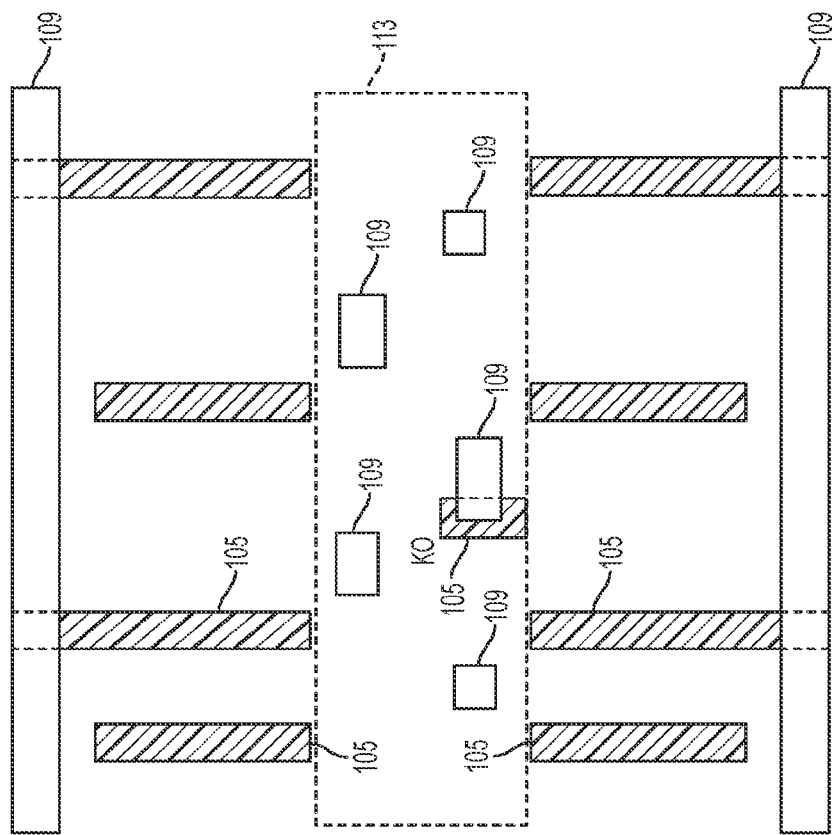

FIGS. 1A through 1D schematically illustrate components of a layout with via routing structures, in accordance with an exemplary embodiment of the present disclosure. As shown in FIG. 1A, the layout may include fin structures 101 across gate structures 103 and diffusion contacts 105, gate contacts 107 (e.g., formed through a first mask) and 109 (e.g., formed through a second mask) coupled to gate structures 103, and gate cut regions 111. For simplicity purposes, FIG. 1B depicts the layout in FIG. 1A with only diffusion contacts 107 and gate contacts 109. As illustrated, at least one of the diffusion contacts 105 is formed in diffusion gap region (or RX gap region) 113, for instance, to provide a hand-shake construct with one of the gate contacts 109 to enable the landing of a via0 layer structure. This hand-shake construct is desired since the gate contact 109 cannot be extended or made larger due to time-dependent dielectric breakdown (TDDB) reliability issues. However, to enable diffusion contact 105 to be SADP decomposable in design, at least some of the diffusion contact 105 may be on the contact-poly pitch grid.

It is noted that there is no merging of the fin structures 101 (e.g., no epi-silicon merging the fin structures 101). As such, the difference between the top/bottom space from gate contact 109 (e.g., in the power rail region within top gate cut region 111) to fin structures 101 and the top/bottom space from gate contact 109 (e.g., in the power rail region) to the diffusion region (e.g., below the power rail region and above diffusion gap region 113) may be reduced.

Figure 1D:
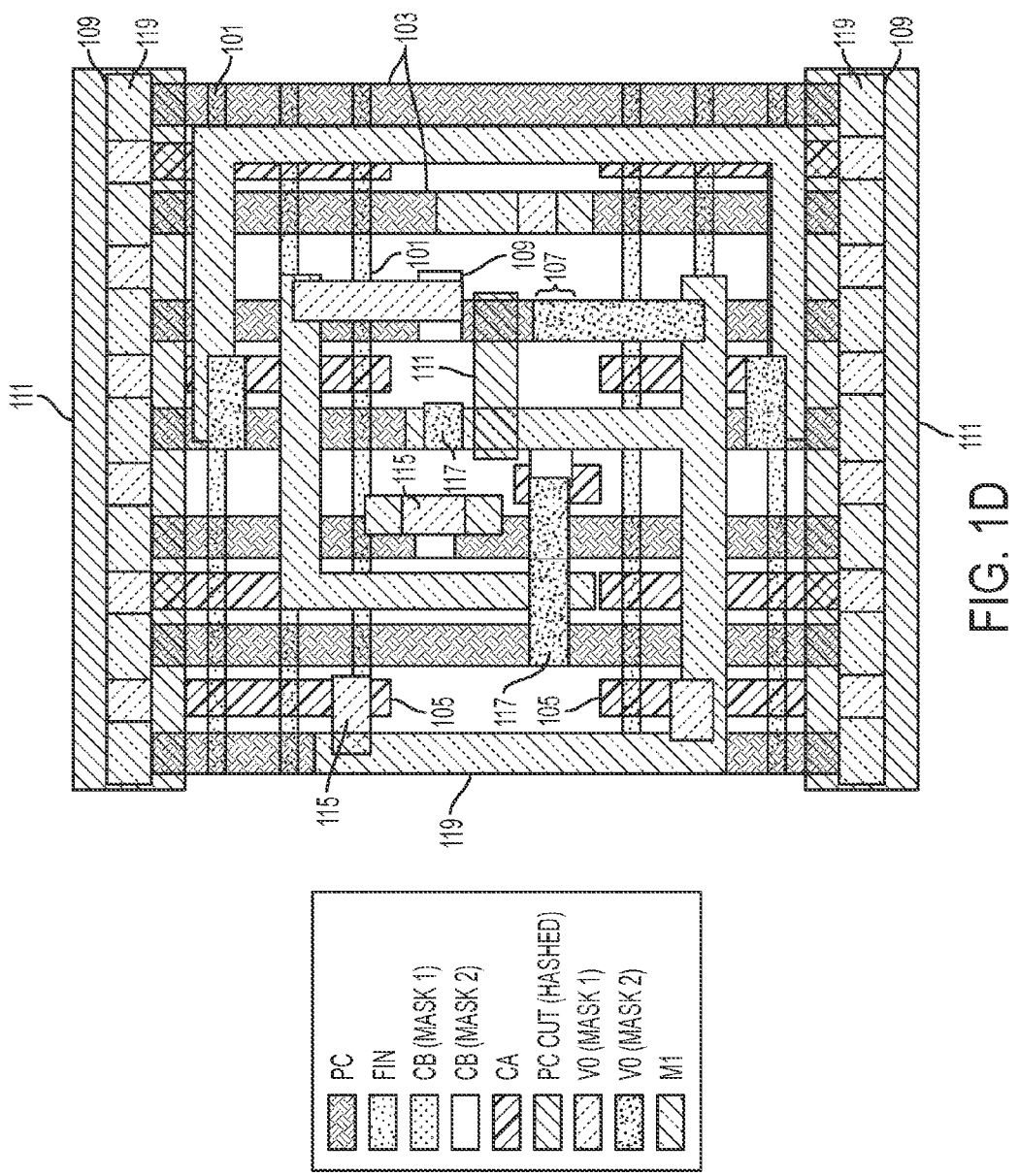

FIGS. 1C and 1D respectively illustrate the via0 layer (e.g., the via layer below and connecting to the metal1 layer) and the metal1 layer (e.g., the metal layer above the via0 layer and below the via1 layer) of the layout. As provided, the via0 layer may include via0 layer structures 115 (e.g., formed through a first mask) and 117 (e.g., formed through a second mask), and the metal1 layer may include metal1 layer structures 119. As depicted, some of the via0 layer structures 115 and 117 enable local routing. The elongated design of some of the via0 layer structures 115 and 117 may, for instance, allow those via0 layer structures 115 and 117 to couple diffusion contacts 105, gate contacts 107 and 109, etc., with metal layer structures 119 that do not overlie those diffusion contacts 105, gate contacts 107 and 109, etc. By way of example, the via0 layer structure 117 over diffusion gap region 113 crosses over one of the gate structures 103 (e.g., third gate structure 103 from the left) and couples the diffusion contact 105 (e.g., through gate contact 109) within the diffusion gap region 113 to one of the metal1 layer structures 119.

By way of another example, one of the via0 layer structures 115 (e.g., over third gate structure 103 from the right) crosses over at least one of the fin structures 101 and couples one of the gate contacts 109 to one of the metal1 layer structures 119 (e.g., over the third centermost gate structures 103). Moreover, another one of the via0 layer structures 117 (e.g., over third gate structure 103 from the right) crosses over at least another one of the fin structures 101 and couples one of the gate contacts 107 to another one of the metal1 layer structures 119 (e.g., over the five leftmost gate structures 103). By using local via0 layer routing (or other via layer routing), cross-coupling-based designs may, for instance, be realized without requiring CA flyovers and/or too many handshake structures between diffusion contacts and gate contacts.

It is noted, however, that while FIGS. 1C and 1D depict a cross-coupling-based design, the local routing provided by the via routing structures may also be applied to layout designs without cross-coupling. In addition, it is also noted that while FIGS. 1C and 1D illustrate the use of elongated via0 layer structures 115 and 117 to couple certain structures (or portions of structures) to metal1 layer structures 119 that do not overlie those certain structures, it is contemplated that local routing provided by via routing structures may applied to other via layer structures and other metal layer structures. In one scenario, for instance, local routing may be implemented by: providing a first metal routing structure on the metal2 layer; providing a second metal routing structure on the metal3 layer such that the second metal routing structure does not overlie the first metal routing structure; and providing a via routing structure on the via2 layer such that the via routing structure is over the first metal routing structure and under the second metal routing structure to couple the first metal routing structure on the metal2 layer to the second metal routing structure on the metal3 layer. In this way, the via routing structures ease restrictions associated with metal routing structure design (e.g., on any of the various metal layers), for instance, that are formed with SADP or other double patterning processes.

Figure 2A:
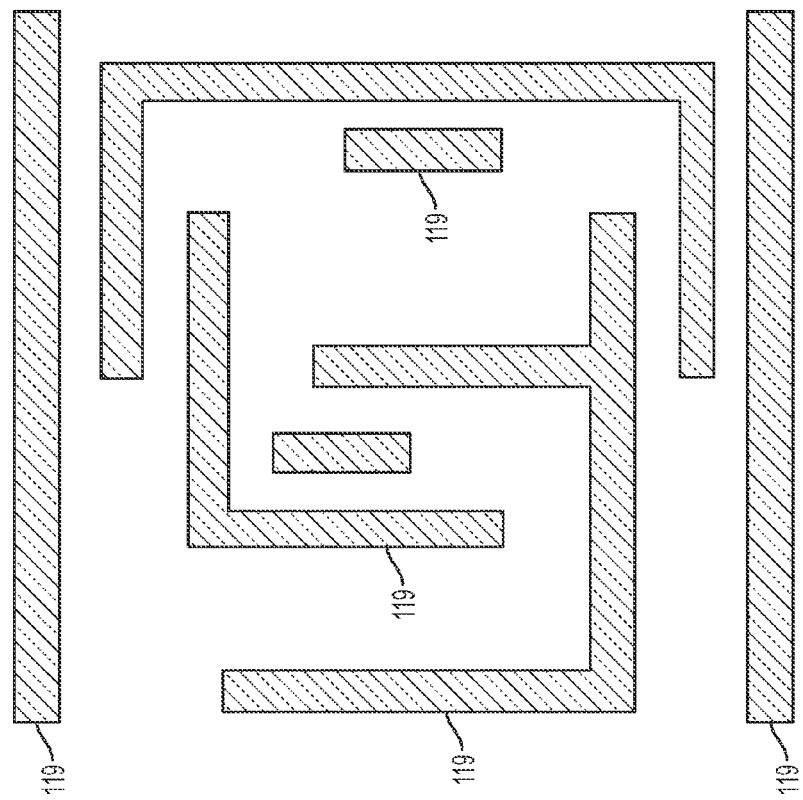
FIGS. 2A through 2C schematically illustrate a SADP process to provide metal routing structures, in accordance with an exemplary embodiment of the present disclosure.
Figure 2C:
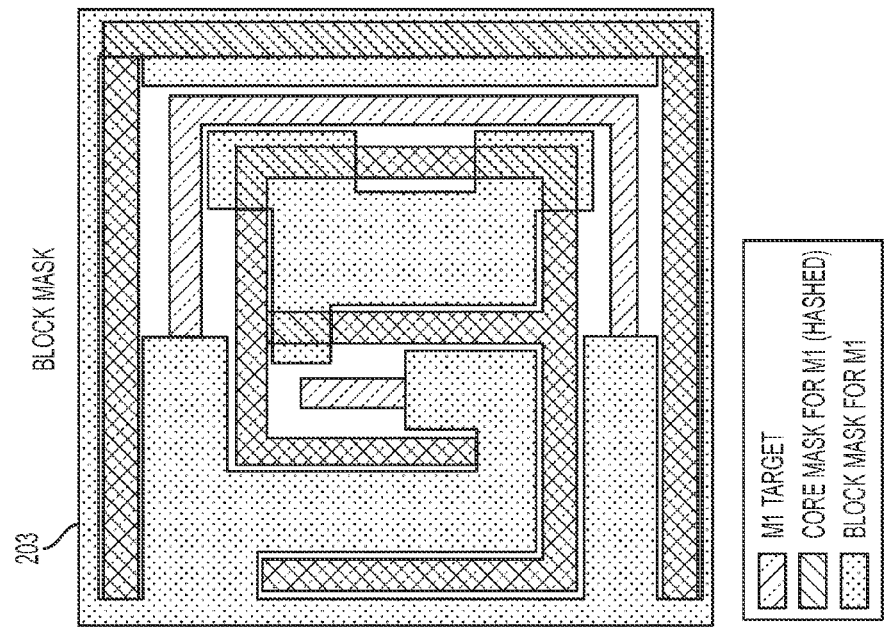
Figure 2B:
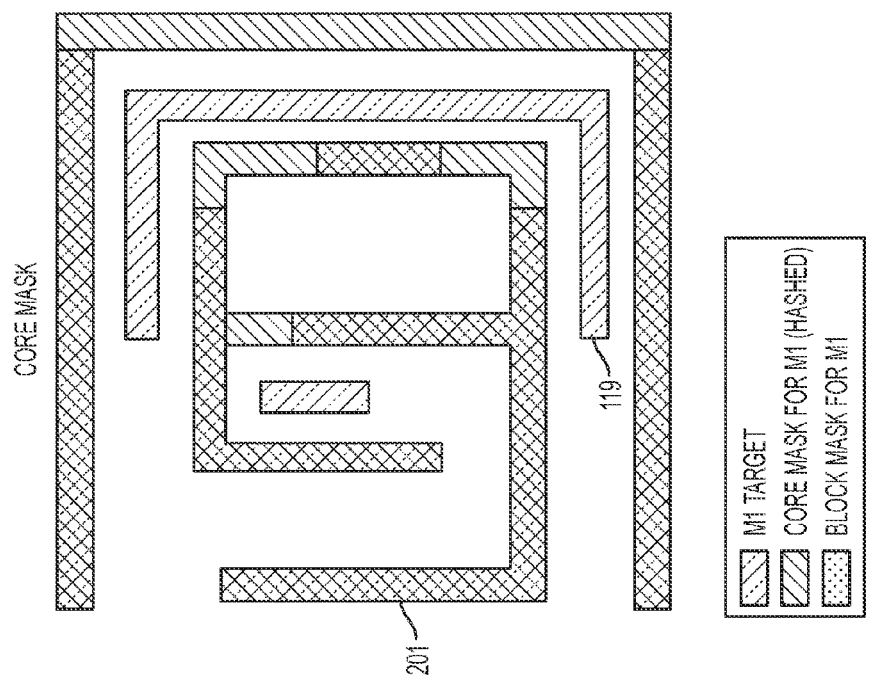

FIGS. 2A through 2C schematically illustrate a SADP process to provide metal routing structures, in accordance with an exemplary embodiment of the present disclosure. For simplicity purposes, FIG. 2A depicts the metal1 layer structures 119 to illustrate the metal1 target (e.g., the resulting metal1 layer structures 119) formed through the SADP process. FIGS. 2B and 2C respectively illustrate the use of core mask 201 (e.g., the first patterning) and the use of block mask 203 (e.g., the second patterning) to form the metal1 target (e.g., the resulting metal1 layer structures 119) in a SADP-compliant manner. By way of example, as illustrated in FIG. 2B, core mask 201 may be formed as sacrificial mandrels. Spacers may then be formed alongside core mask 201, and sacrificial material may be deposited in openings between the spacers and various parts of core mask 201. Later, as shown in FIG. 2C, block mask 203 may be formed over the layer including the spacers and core mask 201. Etching may thereafter be performed to form openings for the metal1 target, for instance, in areas not protected by block mask 203 or the spacers.

Figure 3B:
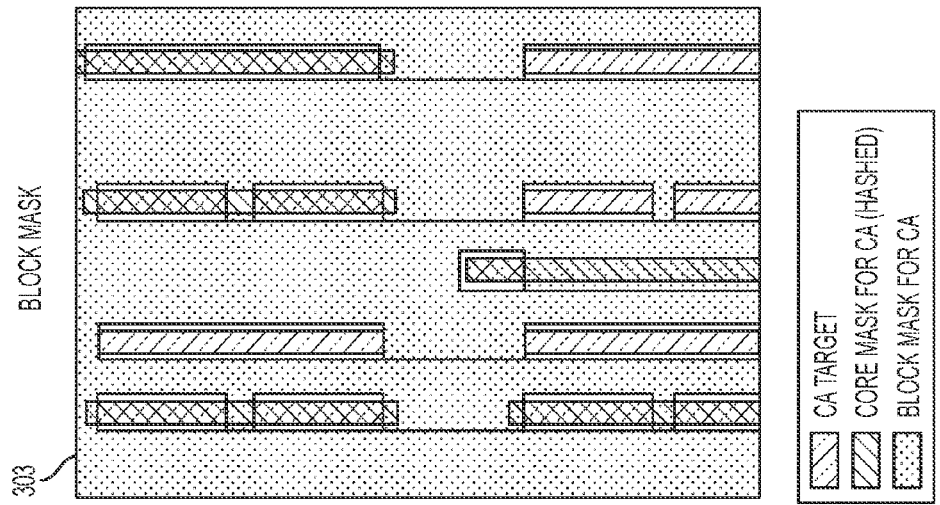
FIGS. 3A and 3B schematically illustrate a SADP process to provide diffusion contacts, in accordance with an exemplary embodiment of the present disclosure.
Figure 3A:
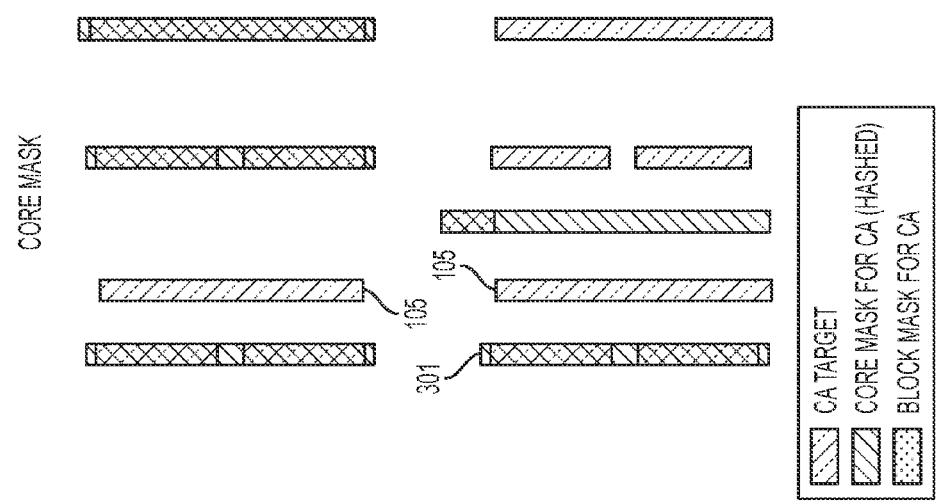

FIGS. 3A and 3B schematically illustrate a SADP process to provide diffusion contacts, in accordance with an exemplary embodiment of the present disclosure. As shown, core mask 301 and block mask 303 may be used to form the diffusion contact target (e.g., the resulting diffusion contacts 105) in a SADP-compliant manner. By way of example, as illustrated in FIG. 3A, core mask 301 may be formed as sacrificial mandrels. Spacers may then be formed alongside core mask 301, and sacrificial material may be deposited in openings between the spacers and various parts of core mask 301. Thereafter, as shown in FIG. 3B, block mask 303 may be formed over the layer including the spacers and core mask 301. Etching may then be performed to form openings for the diffusion contact target, for instance, in areas not protected by block mask 303 or the spacers.

The embodiments of the present disclosure can achieve several technical effects, including increased layout integrity and reduced patterning costs. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a gate structure and a diffusion contact on a substrate;
   providing a gate contact on the gate structure;
   providing a metal routing structure that does not overlie a portion of the gate contact, the diffusion contact, or a combination thereof; and
   providing a via routing structure over the portion and under a part of the metal routing structure to couple the gate contact, the diffusion contact, or a combination thereof to the metal routing structure,
   wherein the diffusion contact is provided in a diffusion gap region in the substrate.

2. The method according to claim 1, further comprising:
   providing a second gate structure on the substrate; and
   providing the via routing structure to cross over the second gate structure to couple the diffusion contact, the gate contact, or a combination thereof to the metal routing structure.

3. The method according to claim 2, further comprising:
   providing a third gate structure on the substrate;
   providing a second metal routing structure over the substrate;
   providing a second gate contact on the first, second, or third gate structures;
   providing a plurality of fin structures across the first, second, and third gate structures; and
   providing a second via routing structure crossing over at least one of the fin structures to couple the gate contact, the second gate contact, or a combination thereof to the metal routing structure, the second metal routing structure, or a combination thereof.

4. The method according to claim 3, wherein the via routing structure and the second via routing structure are via0 layer structures, and the metal routing structure and the second metal routing structure are metal1 layer structures.

5. The method according to claim 3, further comprising:
   providing the plurality of fin structures without merging of the fin structures.

6. The method according to claim 1, further comprising:
   providing another gate structure on the substrate; and
   providing another gate contact to couple the diffusion contact to the other gate structure.

7. The method according to claim 1, further comprising:
   providing the diffusion contact and the metal routing structure using a self-aligned double patterning (SADP) process.

8. The method according to claim 7, wherein the SADP process utilizes a core mask and a block mask over the core mask.

9. A device comprising:
   a gate structure and a diffusion contact on a substrate;
   a gate contact on the gate structure;

a metal routing structure that does not overlie a portion of the gate contact, the diffusion contact, or a combination thereof; and a via routing structure over the portion and under a part of the metal routing structure, wherein the via routing structure couples the gate contact, the diffusion contact, or a combination thereof to the metal routing structure, wherein the diffusion contact is provided in a diffusion gap region in the substrate.

10. The device according to claim 9, further comprising:

a second gate structure on the substrate, wherein the via routing structure crosses over the second gate structure to couple the diffusion contact, the gate contact, or a combination thereof to the metal routing structure.

11. The device according to claim 10, further comprising:
a third gate structure on the substrate;
a second metal routing structure over the substrate;
a second gate contact on the first, second, or third gate structures;
a plurality of fin structures across the first, second, and third gate structures; and
a second via routing structure crossing over at least one of the fin structures, wherein the second via routing structure couples the gate contact, the second gate contact, or a combination thereof to the metal routing structure, the second metal routing structure, or a combination thereof.

12. The device according to claim 11, wherein the via routing structure and the second via routing structure are via0 layer structures, and the metal routing structure and the second metal routing structure are metal1 layer structures.

13. The device according to claim 11, wherein the plurality of fin structures are not merged with each other.

14. The device according to claim 9, further comprising:
another gate structure on the substrate; and
another gate contact coupling the diffusion contact to the other gate structure.

15. The device according to claim 9, wherein the diffusion contact and the metal routing structure are provided using a self-aligned double patterning (SADP) process, and the SADP process utilizes a core mask and a block mask over the core mask.

16. A method comprising:
providing a first metal routing structure over a substrate;
providing a second metal routing structure that does not overlie a portion of the first metal routing structure;
providing a via routing structure over the portion and under a part of the second metal routing structure to couple the first metal routing structure to the second metal routing structures;
providing a gate structure and a diffusion contact on the substrate;
providing a gate contact on the gate structure;
providing a third metal routing structure that does not overlie a second portion of the gate contact, the diffusion contact, or a combination thereof, the third metal routing structure being at a depth level below the second metal routing structure; and
providing a second via routing structure over the second portion and under a part of the third metal routing structure to couple the gate contact, the diffusion contact, or a combination thereof to the third metal routing structure.

17. The method according to claim 16, further comprising:
providing a second gate structure on the substrate; and
providing the second via routing structure to cross over the second gate structure to couple the diffusion contact, the gate contact, or a combination thereof to the third metal routing structure, wherein the second via routing structure is a via0 layer structure, and the third metal routing structure is a metal1 layer structure.

* * * * *